(12) United States Patent
An et al.

(10) Patent No.: US 9,074,506 B2
(45) Date of Patent: Jul. 7, 2015

(54) STRUCTURE FOR OPERATING SYSTEM FOR UTILIZING EXHAUST HEAT OF VEHICLE

(71) Applicant: Hyundai Motor Company, Seoul (KR)

(72) Inventors: Ho-Chan An, Whasung-Si (KR); Jong-Ho Seon, Whasung-Si (KR)

(73) Assignee: HYUNDAI MOTOR COMPANY, Seoul (KR)

( * ) Notice: Subject to any disclaimer, the term of this patent is extended or adjusted under 35 U.S.C. 154(b) by 22 days.

(21) Appl. No.: 14/109,824

(22) Filed: Dec. 17, 2013

(65) Prior Publication Data

US 2015/0075160 A1    Mar. 19, 2015

(30) Foreign Application Priority Data

Sep. 16, 2013    (KR) .................. 10-2013-0110777

(51) Int. Cl.
| | |
|---|---|
| *F01N 5/02* | (2006.01) |
| *H02N 10/00* | (2006.01) |
| *H01L 35/28* | (2006.01) |
| *F02B 33/02* | (2006.01) |
| *H01L 27/16* | (2006.01) |

(52) U.S. Cl.
CPC ............. *F01N 5/025* (2013.01); *F02B 33/02* (2013.01); *Y10S 257/93* (2013.01); *Y02T 10/166* (2013.01); *H01L 27/16* (2013.01)

(58) Field of Classification Search
CPC .............................................. F01N 5/00–5/025
USPC .............. 310/306; 60/320; 136/209, 210, 218
See application file for complete search history.

(56) References Cited

U.S. PATENT DOCUMENTS

| | | | | |
|---|---|---|---|---|
| 3,846,076 A | * | 11/1974 | Henault | 422/97 |
| 4,448,028 A | * | 5/1984 | Chao et al. | 62/3.3 |
| 5,450,869 A | * | 9/1995 | Brittain et al. | 136/203 |
| 5,477,676 A | * | 12/1995 | Benson et al. | 60/274 |
| 7,430,875 B2 | * | 10/2008 | Sasaki et al. | 62/238.2 |
| 2005/0172992 A1 | * | 8/2005 | Shimoji et al. | 136/208 |
| 2006/0053771 A1 | * | 3/2006 | Murata | 60/285 |
| 2006/0101822 A1 | * | 5/2006 | Murata | 60/645 |
| 2012/0060484 A1 | * | 3/2012 | Eder et al. | 60/320 |

(Continued)

FOREIGN PATENT DOCUMENTS

| | | | |
|---|---|---|---|
| DE | 102010028879 A1 | * | 11/2011 |
| DE | 102011056153 A1 | * | 6/2013 |
| DE | 102012112224 A1 | * | 6/2013 |
| EP | 2354487 A1 | * | 8/2011 |

(Continued)

*Primary Examiner* — Thomas Denion
*Assistant Examiner* — Mickey France
(74) *Attorney, Agent, or Firm* — Morgan, Lewis & Bockius LLP

(57) ABSTRACT

A structure for operating a system for utilizing exhaust heat of a vehicle may include a high-temperature part with an exhaust pipe and a bypass passage installed in the exhaust pipe, a thermoelectric element attached to an exterior of the exhaust pipe for generating electricity, a low-temperature part attached to an exterior of the thermoelectric element for flowing a coolant, a first exhaust gas passage installed in the low-temperature part and having both ends connected to the exhaust pipe, a first valve to selectively open or close the first exhaust gas passage, a second exhaust gas passage formed in a space between the inner circumferential surface of the exhaust pipe and an outer circumferential surface of the bypass passage, a second valve disposed at a rear end of the bypass passage, coupled to a valve shaft and rotatable on the basis of the valve shaft, and an operating unit.

7 Claims, 9 Drawing Sheets

(56) References Cited

U.S. PATENT DOCUMENTS

| | | | |
|---|---|---|---|
| 2013/0079981 A1* | 3/2013 | Meisner | 701/36 |
| 2013/0145750 A1* | 6/2013 | An et al. | 60/320 |
| 2014/0182648 A1* | 7/2014 | Seon et al. | 136/211 |
| 2014/0182649 A1* | 7/2014 | Seon et al. | 136/211 |
| 2014/0345662 A1* | 11/2014 | Gauss et al. | 136/205 |

FOREIGN PATENT DOCUMENTS

| | | | |
|---|---|---|---|
| JP | 2002059736 A | * | 2/2002 |
| JP | 2007-247638 A | | 9/2007 |
| JP | 2008-157091 A | | 7/2008 |
| JP | 2010-163899 A | | 7/2010 |
| JP | 2013150420 A | * | 8/2013 |

* cited by examiner

STRUCTURE FOR OPERATING SYSTEM FOR UTILIZING EXHAUST HEAT OF VEHICLE

CROSS-REFERENCE TO RELATED APPLICATIONS

The present application claims priority of Korean Patent Application Number 10-2013-0110777 filed on Sep. 16, 2013, the entire contents of which application are incorporated herein for all purposes by this reference.

BACKGROUND OF INVENTION

1. Field of Invention

The present invention relates to a system for utilizing exhaust heat of a vehicle, and more particularly, to a structure for operating a system for utilizing exhaust heat of a vehicle which has a drive unit which opens and closes all of a bypass passage, a first exhaust gas passage, and a second exhaust gas passage using a single motor in order to operate a system for utilizing exhaust heat of a vehicle which includes the bypass passage, the first exhaust gas passage installed in a low-temperature part, and the second exhaust gas passage formed between an exhaust pipe and the bypass passage to be utilized from when the vehicle initially starts to when the vehicle runs in an overloaded state.

2. Description of Related Art

In general, in a vehicle, depending on a running state of the vehicle, warming up and heating steps for an engine are performed when the vehicle initially starts, a thermoelectric power generating step is performed when the vehicle runs, and a bypassing step is performed when the vehicle runs up a slope or runs in an overloaded state.

A coolant is heated using an exhaust heat recovery device when the vehicle initially starts, such that effects of improving fuel efficiency of the vehicle and reducing exhaust gas may be obtained by shortening time required to preheat (warm up) an engine, and effects of reducing friction in the engine and a transmission and quickly heating the interior in winter may be obtained.

Exhaust heat of the vehicle, which is produced when the vehicle runs, generates electricity while passing through a thermoelectric element of a thermoelectric power generating device. Here, the thermoelectric element refers to an element using a thermoelectric effect in which thermal energy is converted into electrical energy by converting a temperature difference between both ends of the element into electricity, or electrical energy is converted into thermal energy by allowing electricity to flow through the element to cause a temperature difference between both ends of the element.

The thermoelectric element is used in a small-scale cooling device, a small-scale heating device, or a small-scale power generating device.

The thermoelectric element used in a small-scale power generating device is called a thermoelectric power generating device, or a thermoelectric power generator. The thermoelectric power generator is mainly used as an electric power supply device of a radio communication device, an electric power supply device of a spaceship, a power supply device of a nuclear-powered submarine, and a thermoelectric power generator that is installed in a system for utilizing exhaust heat of a vehicle.

When the vehicle runs up a slope or when the vehicle runs in an overloaded state caused by an excessive speed of the vehicle, exhaust heat of the vehicle is quickly discharged to the outside of the vehicle through a bypass passage, and the exhaust heat recovery device or the thermoelectric power generating device is not operated.

However, according to a system for utilizing exhaust heat of a vehicle in the related art, since there is a section where the exhaust heat recovery device or the thermoelectric power generating device is not operated for each state of the vehicle, there is a problem in that overall utilization of the system deteriorates.

That is, the exhaust heat recovery device is operated only when the vehicle initially starts, the thermoelectric power generating device is operated only when the vehicle runs after a temperature of exhaust gas is raised to a certain degree, and none of the exhaust heat recovery device and the thermoelectric power generating device is operated when the vehicle runs in an overloaded state.

The aforementioned problem may be resolved by using a system for utilizing exhaust heat of a vehicle which has all of the exhaust heat recovery device, the thermoelectric power generating device, and the bypass passage, but at least two valves and two individual motors are required to operate the exhaust heat recovery device, the thermoelectric power generating device, and the bypass passage, and thereby, there are still problems about a space, costs, or a weight of a vehicle body.

The information disclosed in this Background section is only for enhancement of understanding of the general background of the invention and should not be taken as an acknowledgement or any form of suggestion that this information forms the prior art already known to a person skilled in the art.

SUMMARY OF INVENTION

The present invention has been made in an effort to provide a structure for operating a system for utilizing exhaust heat of a vehicle which may be utilized from when the vehicle initially starts to when the vehicle runs in an overloaded state by integrating an exhaust heat recovery device and a thermoelectric power generating device, and may operate both the exhaust heat recovery device and the thermoelectric power generating device using a single motor.

Various aspects of the present invention provides a structure for operating a system for utilizing exhaust heat of a vehicle, including: a high-temperature part which includes an exhaust pipe through which high-temperature exhaust gas selectively passes, and a bypass passage which is installed in the exhaust pipe and through which the exhaust gas is selectively bypassed; a thermoelectric element which is attached to an exterior of the exhaust pipe, and generates electricity using a thermoelectric effect; a low-temperature part which is attached to an exterior of the thermoelectric element in a longitudinal direction and in which a coolant flows; a first exhaust gas passage which is installed in the low-temperature part in a longitudinal direction and has both ends connected to the exhaust pipe, and through which the high-temperature exhaust gas selectively passes to heat the coolant; a first valve which is attached to an inner circumferential surface of the exhaust pipe, and formed to selectively open or close one end of the first exhaust gas passage; a second exhaust gas passage which is formed in a space between the inner circumferential surface of the exhaust pipe and an outer circumferential surface of the bypass passage; a second valve which is disposed at a rear end of the bypass passage, coupled to a valve shaft, which is coupled to a side surface of the bypass passage, and installed to be rotatable on the basis of the valve shaft; and an operating unit which has one end connected to the first valve, and the other end connected to a motor and the valve shaft to allow the first valve to be moved in front and rear directions, and to allow the second valve to be rotated on the basis of the valve shaft, by rotation of the motor.

The operating unit may include: an extension portion which is extended rearward from a side surface of the first valve, and has a slit formed in the extension portion in up and down directions; a first link which has one end, which is accommodated in the slit to be slidable in up and down directions, and is extended rearward; a second link which has one end that is rotatably connected to the other end of the first link; and a motor drive shaft which is coupled to the other end of the second link, and connects the motor and the second link to allow the second link to be rotated by the rotation of the motor.

The structure for operating a system for utilizing exhaust heat of a vehicle according to the present invention may further include: a valve shaft protruding portion which is formed to protrude at an end of the valve shaft in the longitudinal direction, and has a cross section of a circular sector shape whose central angle is about 90°; a motor drive shaft depressed portion which is formed to be depressed at an end of the motor drive shaft to accommodate the valve shaft protruding portion; and a motor drive shaft protruding portion which is formed to protrude in the motor drive shaft depressed portion, and has a cross section of a circular sector shape whose central angle is about 90°.

When the vehicle runs, the first link may be disposed at a lower end of the slit to allow the first valve to close the one end of the first exhaust gas passage, and the valve shaft protruding portion and the motor drive shaft protruding portion may be disposed in the motor drive shaft depressed portion at positions where the valve shaft protruding portion and the motor drive shaft protruding portion face each other.

When the vehicle initially starts, the motor drive shaft may be rotated clockwise at about 90° by the motor on the basis of a position of the motor when the vehicle runs to allow the first link to be disposed substantially at a center portion of the slit, the first valve may be moved forward depending on a position of the first link to open the one end of the first exhaust gas passage, and the valve shaft protruding portion and the motor drive shaft protruding portion may be disposed at an upper portion of the motor drive shaft depressed portion in a state in which side surfaces of the valve shaft protruding portion and the motor drive shaft protruding portion are in contact with each other.

When the vehicle runs in an overloaded state, the motor drive shaft may be rotated clockwise at about 180° by the motor on the basis of a position of the motor when the vehicle runs to allow the first link to be disposed at an upper end of the slit, the first valve may close the one end of the first exhaust gas passage depending on a position of the first link, and the valve shaft protruding portion may be rotated clockwise at about 90° or at about 90° by rotation of the motor drive shaft protruding portion, in a state in which the valve shaft protruding portion is in contact with the motor drive shaft protruding portion, to rotate the second valve.

The low-temperature part may include: a coolant passage which is coupled to an outer surface of the thermoelectric element, and cools a contact surface with the thermoelectric element using the coolant that flows in the coolant passage; a coolant distributor which is mounted to one side of the coolant passage to be fluidically communicated with the coolant passage, and has a coolant inlet into which the coolant flows; and a coolant collector which is mounted to the other side of the coolant passage to be fluidically communicated with the coolant passage, and has a coolant outlet from which the coolant is discharged, in which the coolant passage, the coolant distributor, and the coolant collector are integrally formed to be disposed in the longitudinal direction and to be fluidically communicated with each other.

According to various aspects of the present invention, the structure for operating a system for utilizing exhaust heat of a vehicle includes the first exhaust gas passage which is installed in the low-temperature part in a longitudinal direction and in which the high-temperature exhaust gas passes through to heat the coolant, the first valve which is formed to selectively open or close one end of the first exhaust gas passage, the second exhaust gas passage which is formed in a space between the inner circumferential surface of the exhaust pipe and an outer circumferential surface of the bypass passage, and the second valve which is rotatably installed at a rear end of the bypass passage, and thereby, since an exhaust heat recovery device and a thermoelectric power generating device are integrated, the structure for operating a system for utilizing exhaust heat of a vehicle may be utilized when the vehicle initially starts, when the vehicle runs, and when the vehicle runs in an overloaded state.

The structure for operating a system for utilizing exhaust heat of a vehicle includes the operating unit which allows the first valve to be moved in front and rear directions, and to allow the second valve to be rotated on the basis of the valve shaft, using rotation of a single motor, thereby reducing a space for mounting the motor, production costs, and a weight of a vehicle body.

The operating unit includes the extension portion which has a slit formed in the extension portion in up and down directions, the first link which is accommodated in the slit to be slidable in up and down directions, and is extended rearward, the second link which has one end that is rotatably connected to the other end of the first link, and the motor drive shaft which connects the motor and the second link to allow the second link to be rotated by rotation of the motor, thereby moving the first valve in front and rear directions so that the first exhaust gas passage may be opened when the vehicle initially starts, and the first exhaust gas passage may be closed when the vehicle runs and when the vehicle runs in an overloaded state.

The structure for operating a system for utilizing exhaust heat of a vehicle further includes the valve shaft protruding portion which is formed to protrude at an end of the valve shaft in a longitudinal direction, the motor drive shaft depressed portion which is formed to be depressed to accommodate the valve shaft protruding portion, and the motor drive shaft protruding portion which is formed to protrude in the motor drive shaft depressed portion, such that positions of the valve shaft protruding portion and the motor drive shaft protruding portion are varied in conjunction with each other by a single motor, thereby moving or rotating the first valve or the second valve depending on a running state of the vehicle.

The low-temperature part includes the coolant passage, the coolant distributor, and the coolant collector, in which the coolant passage, the coolant distributor, and the coolant collector are integrally formed to be disposed in a longitudinal direction and to be communicated with each other, thereby maximizing efficiency of the system for utilizing exhaust heat of a vehicle.

Consequently, the structure for operating a system for utilizing exhaust heat of a vehicle according to the present invention performs functions of both an exhaust heat recovery device and a thermoelectric power generating device, and integrates systems, which was divided into two devices in the related art, into a single system, thereby reducing a weight of the vehicle, and production costs, and the first valve and the second valve are operated by a single motor, thereby reducing a space for mounting the motor, and production costs.

The methods and apparatuses of the present invention have other features and advantages which will be apparent from or are set forth in more detail in the accompanying drawings, which are incorporated herein, and the following Detailed Description, which together serve to explain certain principles of the present invention.

DETAILED DESCRIPTION

Figure 1:
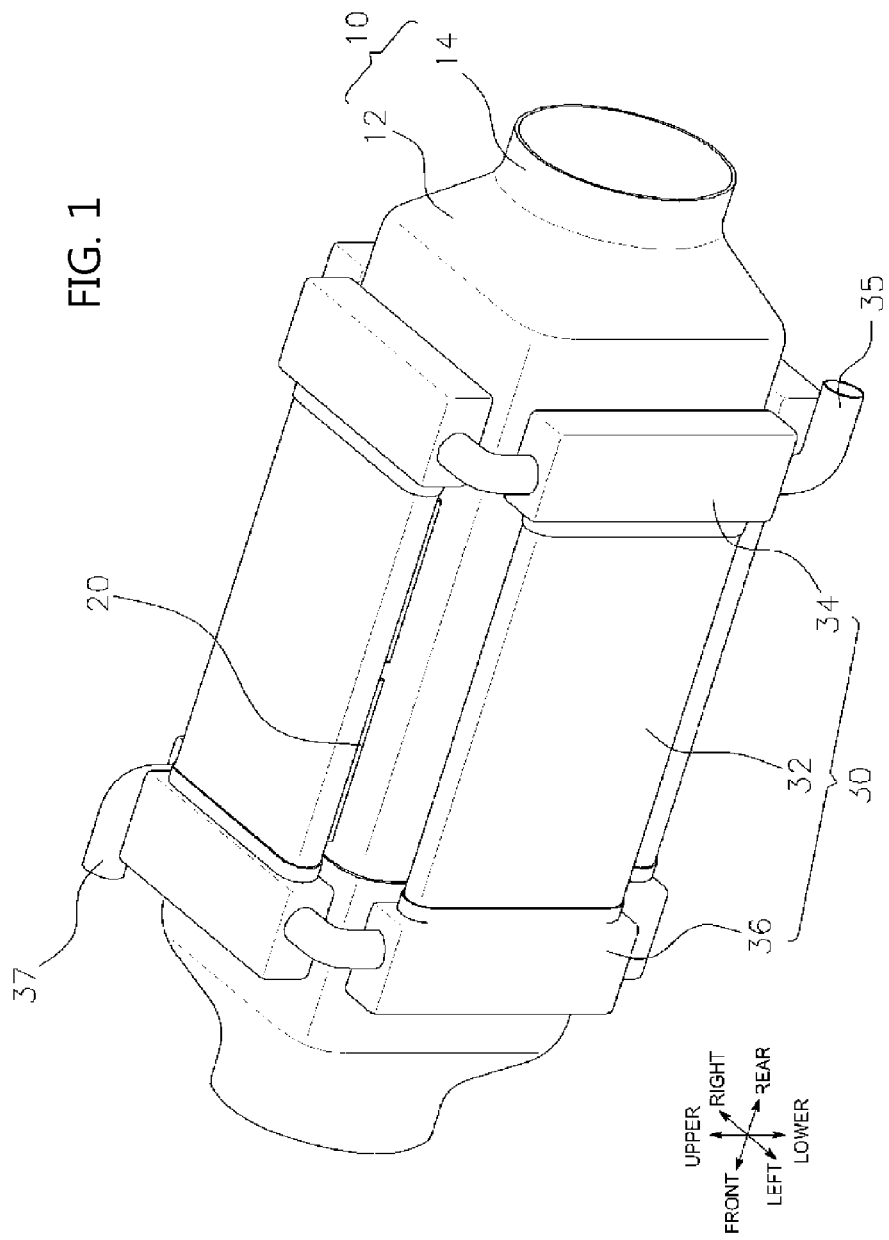
FIG. 1 is a perspective view illustrating a state of an exemplary structure for operating a system for utilizing exhaust heat of a vehicle according to the present invention when viewed from the outside.

Reference will now be made in detail to various embodiments of the present invention(s), examples of which are illustrated in the accompanying drawings and described below. While the invention(s) will be described in conjunction with exemplary embodiments, it will be understood that the present description is not intended to limit the invention(s) to those exemplary embodiments. On the contrary, the invention(s) is/are intended to cover not only the exemplary embodiments, but also various alternatives, modifications, equivalents and other embodiments, which may be included within the spirit and scope of the invention as defined by the appended claims.

A structure for operating a system for utilizing exhaust heat of a vehicle according to the present invention includes: a high-temperature part 10 which includes an exhaust pipe 12 in which high-temperature exhaust gas passes through, and a bypass passage 14 which is installed in the exhaust pipe 12 and through which the exhaust gas is bypassed; a thermoelectric element 20 which is attached to the exterior of the exhaust pipe 12 and generates electricity using a thermoelectric effect; a low-temperature part 30 which is attached to the exterior of the thermoelectric element 20 in a longitudinal direction and in which a coolant flows; a first exhaust gas passage 40 which is installed in the low-temperature part 30 in a longitudinal direction and has both ends connected to the exhaust pipe 12, and in which the high-temperature exhaust gas passes through to heat the coolant; a first valve 42 which is attached to an inner circumferential surface of the exhaust pipe 12, and formed to open and close one end of the first exhaust gas passage 40; a second exhaust gas passage 16 which is formed in a space between the inner circumferential surface of the exhaust pipe 12 and an outer circumferential surface of the bypass passage 14; a second valve 50 which is disposed at a rear end of the bypass passage 14, coupled to a valve shaft 52, which is coupled to a side surface of the bypass passage 14, and installed to be rotatable on the basis of the valve shaft 52; and an operating unit 60 which has one end connected to the first valve 42, and the other end connected to a motor and the valve shaft 52, to allow the first valve 42 to be moved in front and rear directions, and to allow the second valve 50 to be rotated on the basis of the valve shaft 52, by rotation of the motor.

As illustrated in FIG. 1, the high-temperature exhaust gas passes through in the exhaust pipe 12, an inlet and an outlet of the exhaust pipe 12 are formed in a cylindrical shape in various embodiments, and a portion of the exhaust pipe 12 between the inlet and the outlet has a quadrangular container shape whose cross section is quadrangular, but the exhaust pipe 12 may be formed in various shapes in accordance with a type of vehicle, a configuration of a system for utilizing exhaust heat of a vehicle, or the like.

Figure 2:
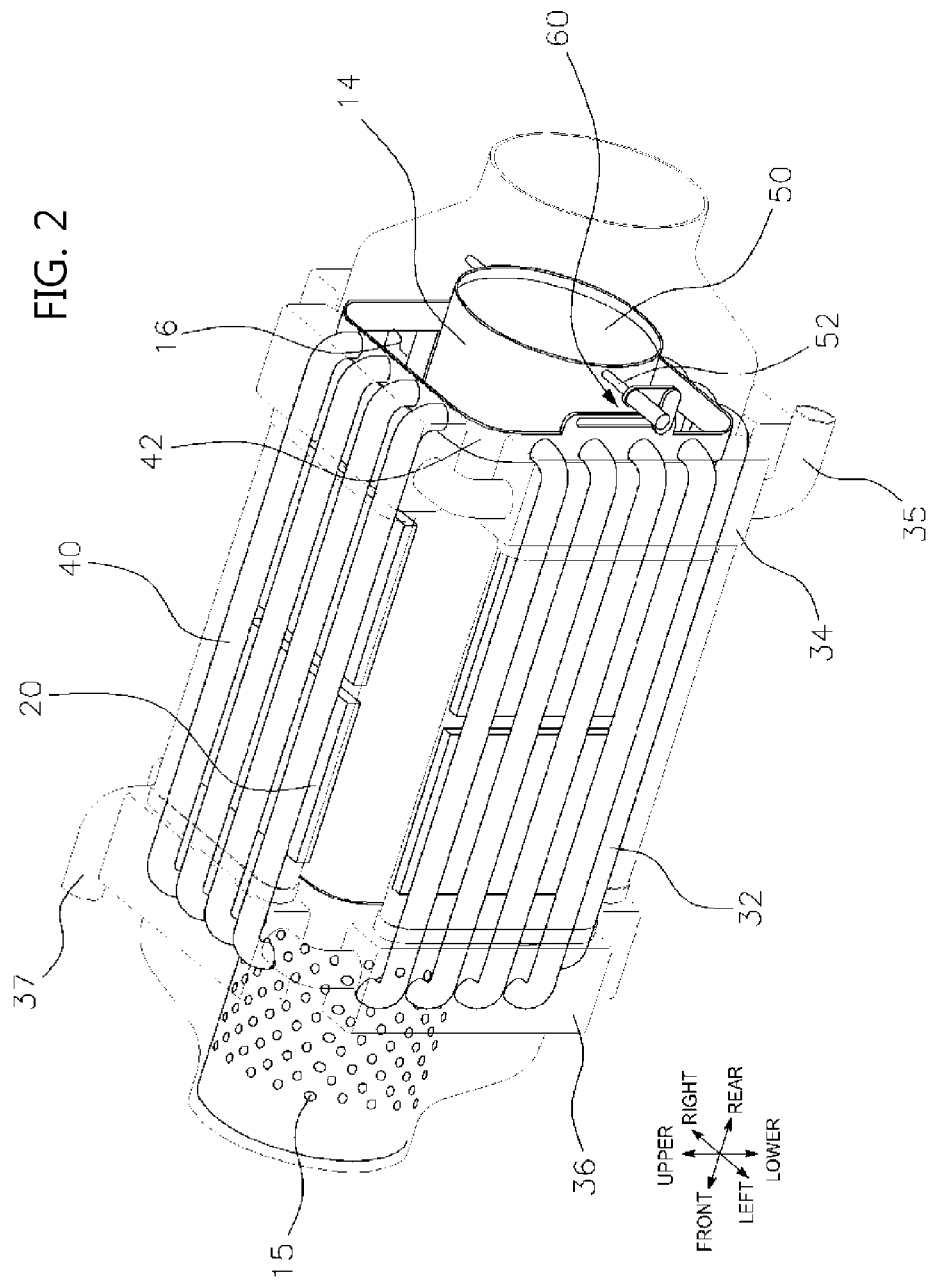
FIG. 2 is a perspective view illustrating a state of the interior which is seen through to show relationships between constituent elements in an exemplary structure for operating a system for utilizing exhaust heat of a vehicle according to the present invention.

As illustrated in FIG. 2, the bypass passage 14 is installed in the exhaust pipe 12, and similarly to a typical bypass passage, the bypass passage 14 is formed in a cylindrical shape so that the exhaust gas may be bypassed when the vehicle runs in an overloaded state. A plurality of exhaust holes 15, which is pierced, is formed at an upstream portion of the bypass passage 14 so that the exhaust gas flows through the first exhaust gas passage 40 and the second exhaust gas passage 16, which are described below.

As illustrated in FIG. 2, the thermoelectric element 20 is formed by bonding a P-type semiconductor and an N-type semiconductor, and attached to the exterior of the exhaust pipe 12, and the thermoelectric elements 20 are electrically connected to a battery of the vehicle in a state in which the thermoelectric elements 20 are electrically connected to each other.

A portion where the thermoelectric element 20 is in contact with the exhaust pipe 12 is heated by the exhaust gas, and a portion where the thermoelectric element 20 is in contact with the low-temperature part 30 is cooled by the coolant, and therefore, a temperature difference between side surfaces of the thermoelectric element 20 occurs. Further, by the temperature difference, a thermoelectric effect occurs in the thermoelectric element 20 such that electricity is produced. The produced electricity charges the battery of the vehicle which is electrically connected to the thermoelectric element 20.

Figure 3:
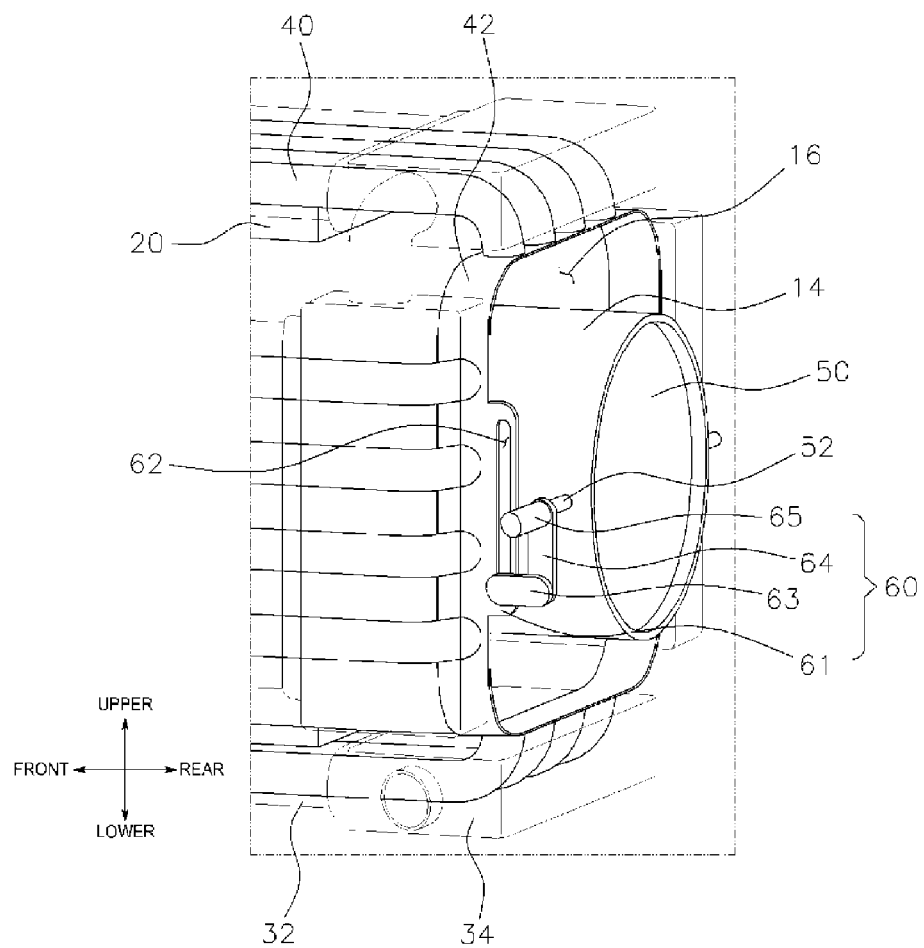
FIG. 3 is an enlarged view illustrating a state of an operating unit in an exemplary structure for operating a system for utilizing exhaust heat of a vehicle according to the present invention.

As illustrated in FIGS. 2 and 3, the low-temperature part 30 in which the coolant flows is attached to the exterior of the thermoelectric element 20, and the first exhaust gas passage 40 is disposed in the low-temperature part 30 in a longitudinal direction. In various embodiments, a plurality of first exhaust gas passages 40 is disposed in a row in the low-temperature part 30, and formed in a pipe shape whose both ends are curved in a direction toward the exhaust pipe 12.

When the vehicle initially starts, the coolant is heated by the exhaust gas that flows in through the first exhaust gas passage 40, and the first exhaust gas passage 40 serves as an exhaust heat recovery device of the vehicle.

As illustrated in FIGS. 2 and 3, the first valve 42 is slidably installed between the exhaust pipe 12 and the first exhaust gas passage 40 to be able to selectively open or close the first exhaust gas passage 40.

In various embodiments, the first valve 42 is formed as a ring-shaped band that is coupled to the inner circumferential surface of the exhaust pipe 12, and slides forward and rearward in a longitudinal direction of the exhaust pipe 12 by the operating unit 60, which has one end connected to the first valve 42, and the other end connected to the motor and the valve shaft 52, thereby selectively opening or closing the first exhaust gas passage 40. That is, when the vehicle initially starts, the first valve 42 is moved forward to open the first exhaust gas passage 40, and the exhaust gas heats the coolant while passing through the first exhaust gas passage 40.

When the vehicle runs or when the vehicle runs in an overloaded state, the first valve 42 is moved rearward to close the first exhaust gas passage 40, and the exhaust gas performs thermoelectric power generation with the thermoelectric element 20 or is bypassed while passing through the second exhaust gas passage 16 or the bypass passage 14.

While in various embodiments, the first valve 42 is formed in a shape like a ring, the first valve 42 may be formed in various shapes such as a straight line-shaped plate which is disposed in an inlet of the first exhaust gas passage 40 and is rotated, or a shape in which a cap protrudes from the exhaust pipe 12 to open and close the first exhaust gas passage 40, in consideration of variations of the structure for utilizing exhaust heat of a vehicle, variations in shape of the first exhaust gas passage, or utilization of overall exhaust heat of a vehicle.

As illustrated in FIGS. 2 and 3, the high-temperature part 10 includes the second exhaust gas passage 16 which is formed between the exhaust pipe 12 and the bypass passage 14 to allow the exhaust gas to pass therethrough, and the second valve 50 which is rotatably installed at a rear end of the bypass passage 14 to adjust an amount of exhaust gas that is bypassed.

When the first exhaust gas passage 40 is closed by the first valve 42, and the bypass passage 14 is closed by the second valve 50, the exhaust gas heats one side surface of the thermoelectric element 20 while passing through the second exhaust gas passage 16, and thereby, thermoelectric power generation occurs at the thermoelectric element 20.

In order to prevent the exhaust pipe 12 from being heated when the vehicle runs up a slope or when the vehicle runs at a high speed, that is, when a load of the engine is increased, the second valve 50 is opened when the vehicle runs in an overloaded state to allow most of the high-temperature exhaust gas to be discharged through the bypass passage 14, such that an amount of exhaust gas, which flows between the bypass passage 14 and the exhaust pipe 12, is adjusted.

In the various embodiments, the second valve 50 is formed in a circular plate shape, connected to the valve shaft 52, which is coupled to the side surface of the bypass passage 14, and rotated on the basis of the valve shaft 52 by the operating unit 60. However, the shape or configuration of the second valve 50 is not limited to the illustrated exemplary embodiment, and is readily varied.

As illustrated in FIGS. 1 and 2, the low-temperature part 30 includes: a coolant passage 32 which is in contact with and coupled to the exterior of the thermoelectric element 20, and cools a contact surface with the thermoelectric element 20 using the coolant that flows in the coolant passage 32; a coolant distributor 34 which is mounted to one side of the coolant passage 32 to be communicated with the coolant passage 32, and has a coolant inlet 35 into which the coolant flows; and a coolant collector 36 which is mounted to the other side of the coolant passage 32 to be communicated with the coolant passage 32, and has a coolant outlet 37 from which the coolant is discharged.

In various embodiments, the coolant passage 32 is formed as four quadrangular plates of which the interior is vacant so that the coolant may flow therethrough, and the coolant passage 32 is coupled to each of the outer surfaces of the exhaust pipe 12 that is formed in a quadrangular container shape.

The coolant distributor 34 is mounted at a rear side of the coolant passage 32, and in various embodiments, the coolant inlet 35 is provided at a left lower end of the exhaust pipe 12 such that the coolant flows into the coolant distributor 34.

The coolant collector 36 is mounted at a front side of the coolant passage 32, and in various embodiments, the coolant outlet 37 is provided at a right upper end of the exhaust pipe 12 such that the coolant is discharged through the coolant collector 36.

One would appreciate that the shape or configuration of the coolant passage 32, the coolant distributor 34 and coolant collector 36 is not limited to the illustrated exemplary embodiment, and is readily varied.

As illustrated in FIG. 2, the coolant, which flows through the coolant passage 32, and the exhaust gas, which flows through the first exhaust gas passage 40, flow in opposite directions, and in this process, the high-temperature exhaust gas heats the coolant.

The coolant collector 36, the coolant passage 32, and the coolant distributor 34 are integrally or monolithically formed to be disposed in turn in a longitudinal direction of the exhaust pipe 12, the respective coolant collectors 36 are connected by curved pipes, and the respective coolant distributors 34 are connected by curved pipes.

As illustrated in FIG. 3, the operating unit 60 may include an extension portion 61 which is extended rearward from a side surface of the first valve 42 and has a slit 62 formed in the extension portion 61 in up and down directions, a first link 63 which has one end, which is accommodated in the slit 62 to be slidable in the up and down directions, and is extended rearward, a second link 64 which has one end that is rotatably connected to the other end of the first link 63, and a motor drive shaft 65 which is coupled to the other end of the second link 64 and connects the motor and the second link 64 to allow the second link 64 to be rotated by rotation of the motor.

As illustrated in FIG. 3, the extension portion 61 has the slit 62 that is elongated in the extension portion 61 in the up and down directions, the entire shape of the extension portion 61 is also elongated in the up and down directions like the slit 62, and the extension portion 61 is extended rearward from the side surface of the first valve 42.

The extension portion 61 is attached to the first valve 42, and when the extension portion 61 is moved in the front and rear directions, the first valve 42 is also moved in the front and rear directions.

One end of the first link 63 is accommodated in the slit 62 of the extension portion 61, and specifically, the first link 63 has a sliding portion, which is attached to one end of the first link 63 or is formed by forming one end of the first link 63 to protrude in a direction toward the slit 62, such that the sliding portion of the first link 63 is moved in the up and down directions along the slit 62.

The sliding portion of the first link 63 may be formed in a cylindrical shape that has a diameter equal to or slightly smaller than a diameter of an inner circumferential surface of the slit 62.

One end of the second link 64, which is formed in a bar shape, is pivotably coupled to the other end of the first link 63, and the second link 64 serves to connect the first link 63 and the motor drive shaft 65.

The motor drive shaft 65, which connects the motor and the second link 64, is coupled to the other end of the second link 64, the second link 64 is rotated by rotation of the motor drive shaft 65 connected to the motor, and the first link 63 is moved in the up and down directions along the slit 62 by rotation of the second link 64.

Figure 5:
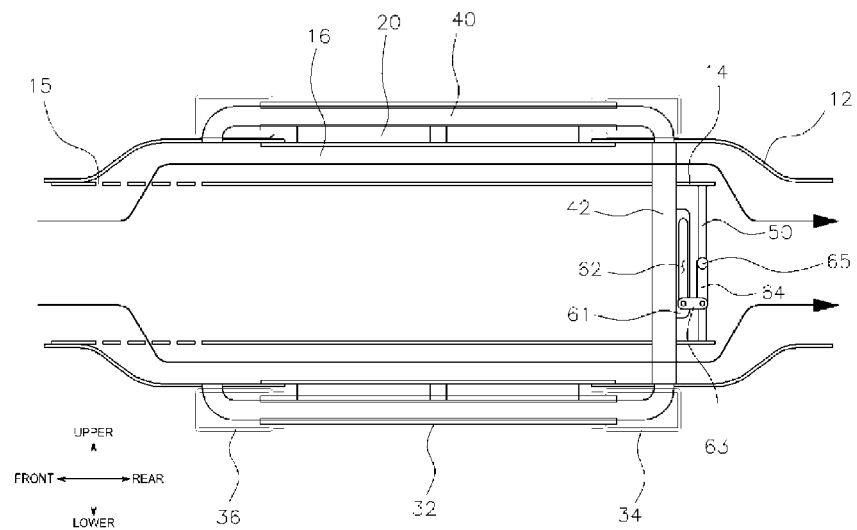
FIG. 5 is a cross-sectional view illustrating a state of an exemplary structure for operating a system for utilizing exhaust heat of a vehicle according to the present invention when the vehicle runs.

As illustrated in FIG. 5, when the vehicle runs, the motor does not rotate, the motor drive shaft 65 is not rotated either, the first link 63 is disposed at a lower end of the slit 62 in a horizontal direction, and the second link 64 is disposed in a vertical direction between the motor drive shaft 65 and the first link 63.

According to the aforementioned arrangement, the first valve 42 closes one end of the first exhaust gas passage 40 to prevent the exhaust gas from flowing through the first exhaust gas passage 40.

Figure 7:
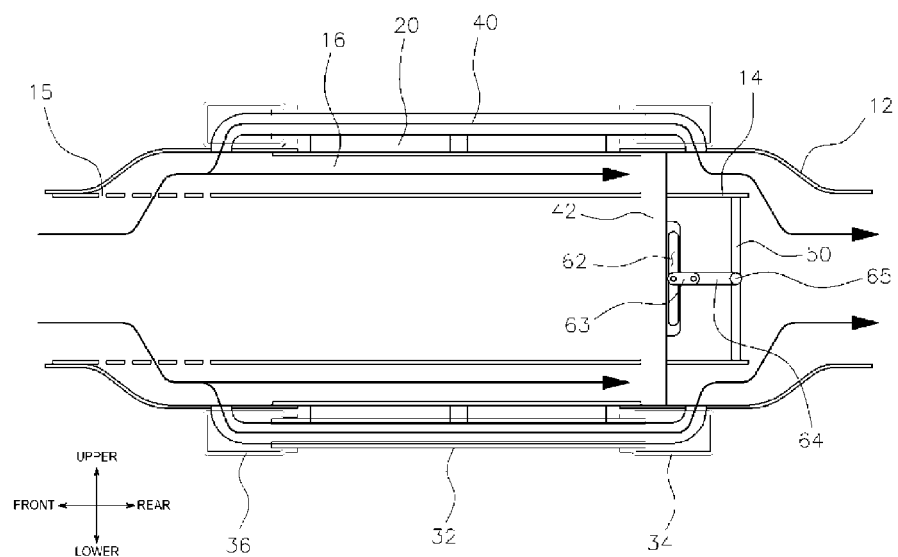
FIG. 7 is a cross-sectional view illustrating a state of an exemplary structure for operating a system for utilizing exhaust heat of a vehicle according to the present invention when the vehicle initially starts.

As illustrated in FIG. 7, when the vehicle initially starts, the motor rotates clockwise at 90° or at about 90°, the motor drive shaft 65 is also rotated clockwise at 90° or at about 90°, the second link 64 is also rotated clockwise at 90° or at about 90° by rotation of the motor drive shaft 65 to be disposed in the horizontal direction, and the first link 63 is moved upward along the slit 62 by rotation of the second link 64 to be disposed in the horizontal direction at a center of the slit 62.

According to the aforementioned arrangement, the first valve 42 is entirely moved forward to open one end of the first exhaust gas passage 40 and to allow the exhaust gas to flow through the first exhaust gas passage 40.

Figure 9:
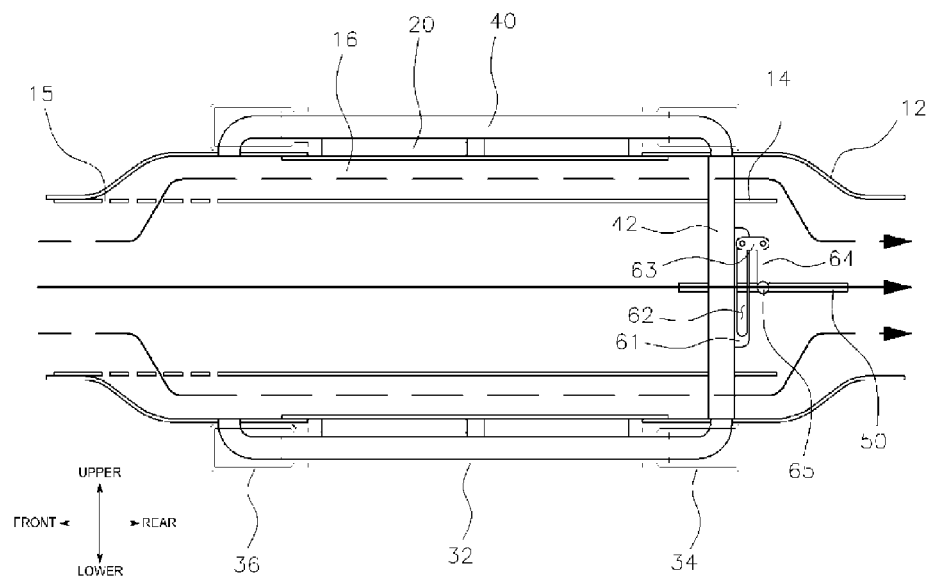
FIG. 9 is a cross-sectional view illustrating a state of an exemplary structure for operating a system for utilizing exhaust heat of a vehicle according to the present invention when the vehicle runs in an overloaded state.

As illustrated in FIG. 9, when the vehicle runs in an overloaded state, the motor rotates clockwise at 180° or at about 180°, the motor drive shaft 65 is also rotated clockwise at 180° or at about 180°, the second link 64 is also rotated clockwise at 180° or at about 180° by rotation of the motor drive shaft 65 to be disposed upward in a vertical direction, and the first link 63 is moved upward along the slit 62 by rotation of the second link 64 to be disposed in the horizontal direction at an upper end of the slit 62.

According to the aforementioned arrangement, the first valve 42 closes one end of the first exhaust gas passage 40 again, and thus prevents the exhaust gas from flowing through the first exhaust gas passage 40.

Figure 4:
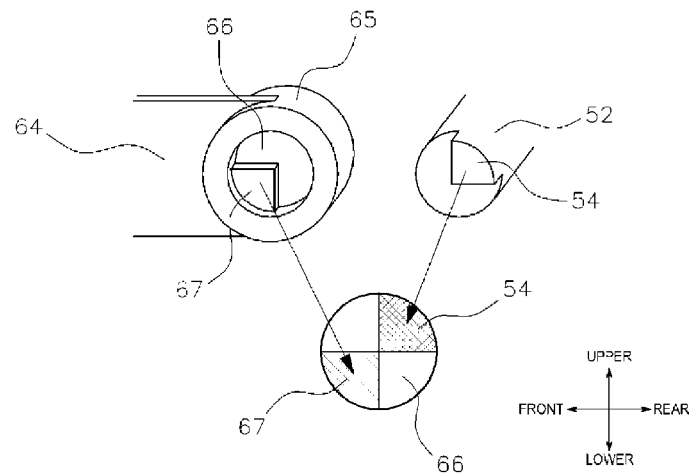
FIG. 4 is a view illustrating states of a motor drive shaft depressed portion, a motor drive shaft protruding portion, and a valve shaft protruding portion in an exemplary structure for operating a system for utilizing exhaust heat of a vehicle according to the present invention.

As illustrated in FIG. 4, a valve shaft protruding portion 54, which has a cross section having a circular sector shape whose central angle is 90°, and protrudes in a longitudinal direction of the valve shaft 52, is formed at an end of the valve shaft 52. That is, the second valve 50 is connected to one end of the valve shaft 52, and the valve shaft protruding portion 54 is formed at the other end (an end portion that is connected to the second link 64) of the valve shaft 52.

A radius of the valve shaft protruding portion 54 may be equal to or substantially equal to a radius of a circular cross section of the valve shaft 52, and a length of an arc of the valve shaft protruding portion 54 may be one-fourth or about one-fourth of a circumference of the circular cross section of the valve shaft 52.

As illustrated in FIG. 4, the motor is connected to one end of the motor drive shaft 65, and a motor drive shaft depressed portion 66, which may accommodate the valve shaft protruding portion 54, is formed at the other end (an end portion that is connected to the second link 64) of the motor drive shaft 65.

The motor drive shaft depressed portion 66 is formed by depressing inward the end of the motor drive shaft 65, and has a circular cross section, and a diameter of the motor drive shaft depressed portion 66 may be equal to or slightly greater than a diameter of the valve shaft 52.

The valve shaft protruding portion 54 is rotatably accommodated in the motor drive shaft depressed portion 66, and when the valve shaft protruding portion 54 is rotated, the valve shaft 52 is rotated to rotate the second valve 50 that is connected to the valve shaft 52.

As illustrated in FIG. 4, a motor drive shaft protruding portion 67, which has a cross section having a circular sector shape whose central angle is 90° and protrudes, is formed in the motor drive shaft depressed portion 66.

A radius of the motor drive shaft protruding portion 67 may be equal to a radius of the circular cross section of the motor drive shaft depressed portion 66, and a length of an arc of the motor drive shaft protruding portion 67 may be one-fourth of a length of a circumference of the circular cross section of the motor drive shaft depressed portion 66.

The motor drive shaft protruding portion 67 and the valve shaft protruding portion 54 may be formed to have the same radius, the arcs having the same length, and the same height, and the motor drive shaft protruding portion 67 and the valve shaft protruding portion 54 may be formed to have a region that is accurately one-fourth of a region in the motor drive shaft depressed portion 66.

Figure 6:
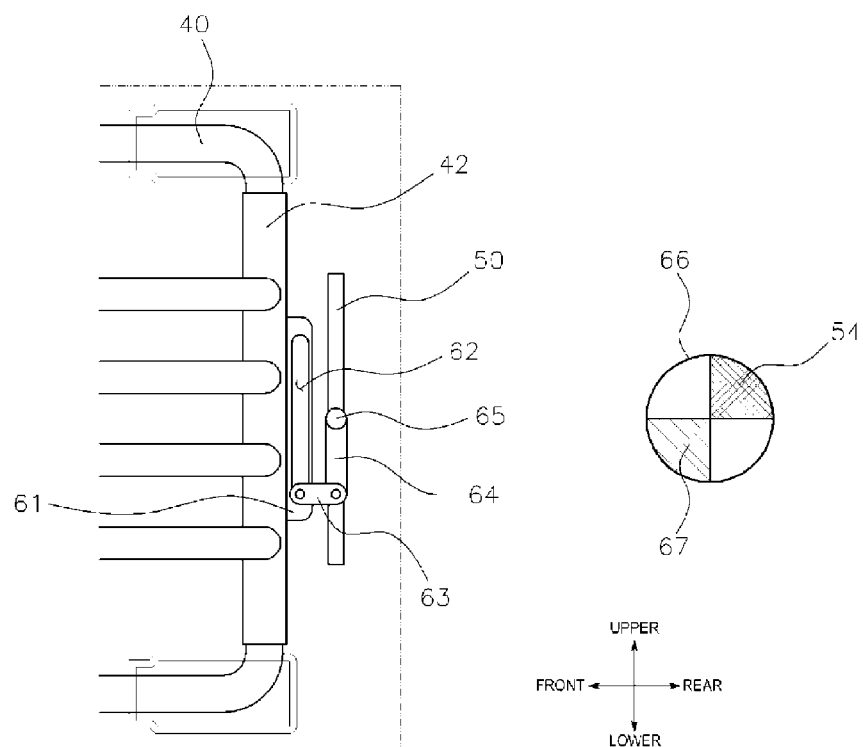
FIG. 6 is a view illustrating states of the motor drive shaft depressed portion, the motor drive shaft protruding portion, and the valve shaft protruding portion in an exemplary structure for operating a system for utilizing exhaust heat of a vehicle according to the present invention when the vehicle runs.

As illustrated in FIG. 6, when the vehicle runs, the motor does not rotate, the motor drive shaft 65 is not rotated either, the motor drive shaft protruding portion 67 is disposed at a front lower end of the motor drive shaft depressed portion 66 in various embodiments, and the valve shaft protruding portion 54 is disposed at a rear upper end of the motor drive shaft depressed portion 66 in various embodiments.

According to the aforementioned arrangement, the second valve 50 is not rotated and closes the bypass passage 14 to prevent the exhaust gas from flowing through the bypass passage 14.

Figure 8:
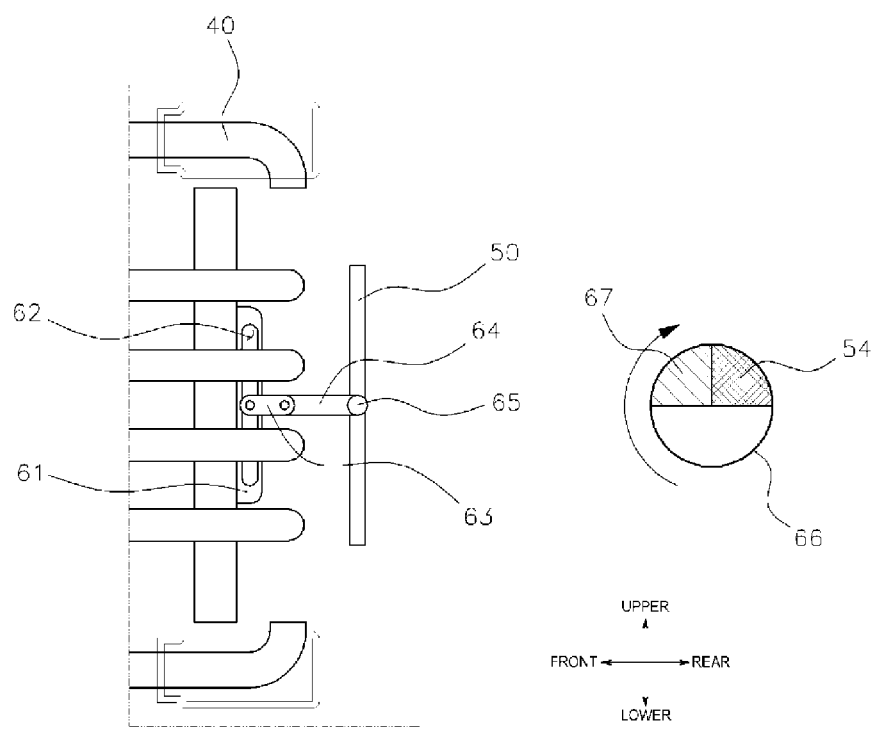
FIG. 8 is a view illustrating states of the motor drive shaft depressed portion, the motor drive shaft protruding portion, and the valve shaft protruding portion in an exemplary structure for operating a system for utilizing exhaust heat of a vehicle according to the present invention when the vehicle initially starts.

As illustrated in FIG. 8, when the vehicle initially starts, the motor rotates clockwise at 90° or at about 90°, the motor drive shaft 65 is also rotated clockwise at 90° or at about 90°, and the motor drive shaft protruding portion 67 is also rotated clockwise at 90° or at about 90° by rotation of the motor drive shaft 65 to be disposed at a front upper end of the motor drive shaft depressed portion 66 in various embodiments. However, the valve shaft protruding portion 54 is not affected by rotation of the motor, and still disposed at the rear upper end of the motor drive shaft depressed portion 66 in various embodiments.

In the aforementioned arrangement, since the valve shaft protruding portion 54 is not affected by rotation of the motor, the second valve 50 still is not rotated and closes the bypass passage 14 to prevent the exhaust gas from flowing through the bypass passage 14.

Figure 10:
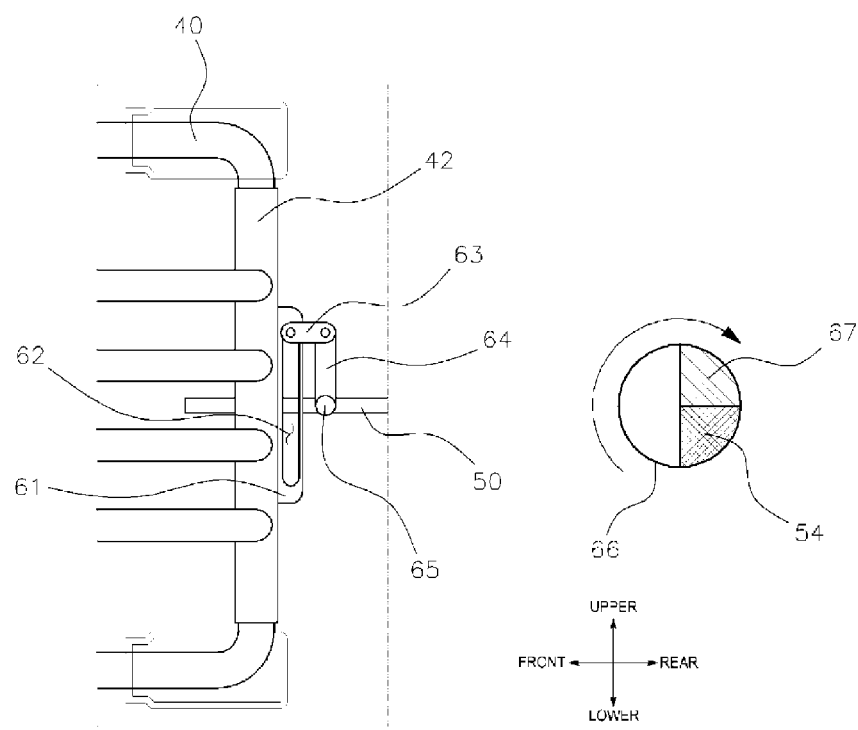
FIG. 10 is a view illustrating states of the motor drive shaft depressed portion, the motor drive shaft protruding portion, and the valve shaft protruding portion in an exemplary structure for operating a system for utilizing exhaust heat of a vehicle according to the present invention when the vehicle runs in an overloaded state.

As illustrated in FIG. 10, when the vehicle runs in an overloaded state, the motor rotates clockwise at 180° or at about 180°, the motor drive shaft 65 is also rotated clockwise at 180° or at about 180°, the motor drive shaft protruding portion 67 is also rotated clockwise at 180° or at about 180° by rotation of the motor drive shaft 65 to be disposed at a rear upper end of the motor drive shaft depressed portion 66 in various embodiments, and the valve shaft protruding portion 54 is pushed by rotation of the motor drive shaft depressed portion 66, and rotated clockwise at 90° or at about 90° to be moved to a rear lower end of the motor drive shaft depressed portion 66 in various embodiments.

In the aforementioned arrangement, the valve shaft protruding portion 54 is rotated clockwise at 90° or at about 90°, and thereby, the second valve 50 is rotated clockwise at 90° or at about 90° to open the bypass passage 14 and to allow the exhaust gas to flow through the bypass passage 14.

Since restoring force is required to return the second valve 50 back to the state in which the second valve 50 is closed from the state in which the second valve 50 is opened, a coupling portion between the side surface of the bypass passage 14 and the valve shaft 52 may be configured as an elastic member, such that when the motor rotates the valve shaft 52 counterclockwise at 90° or at about 90° in order to return the valve shaft 52 back to the initial state, the second valve 50 is also returned back to the initial state, that is, the state in which the second valve 50 is closed, by elastic force.

An operational process of the structure for operating the system for utilizing exhaust heat of a vehicle according to various embodiments of the present invention will be described below.

As illustrated in FIGS. 7 and 8, when the vehicle initially starts, the motor rotates clockwise at 90° or at about 90° to allow the first link 63 and the second link 64 to be disposed at a center portion of the slit 62 in the horizontal direction, and to allow the motor drive shaft protruding portion 67 to be disposed at the front upper end of the motor drive shaft depressed portion 66.

In this case, the first valve 42 is moved forward to open the first exhaust gas passage 40, the second valve 50 is closed, and the exhaust gas is moved through the first exhaust gas passage 40 and directly heats the coolant that flows in the coolant passage 32. Therefore, the structure of the present invention serves as an exhaust heat recovery device of the vehicle.

As illustrated in FIGS. 5 and 6, when the vehicle runs, the motor is not rotated, the first link 63 is disposed at a lower end portion of the slit 62 in the horizontal direction, and the motor drive shaft protruding portion 67 is disposed at the front lower end of the motor drive shaft depressed portion 66.

In this case, the first valve 42 is not moved and closes the first exhaust gas passage 40, and the second valve 50 is not rotated either and closes the bypass passage 14, such that the exhaust gas is moved through the second exhaust gas passage 16 and heats one side surface of the thermoelectric element 20.

Accordingly, a temperature difference occurs between both side surfaces of the thermoelectric element 20, and electricity is produced in the thermoelectric element 20 by the temperature difference, and the electricity produced by the thermoelectric element 20 charges the battery that is electrically connected to the thermoelectric element 20. Therefore, the structure of the present invention serves as a thermoelectric power generating device.

As illustrated in FIGS. 9 and 10, when the vehicle runs in an overloaded state, the motor rotates clockwise at 180° or at about 180°, the first link 63 is disposed at an upper end portion of the slit 62 in the horizontal direction, and the valve shaft protruding portion 54 is pushed by the motor drive shaft protruding portion 67, and rotated to the rear lower end of the motor drive shaft depressed portion 66.

In this case, the first valve 42 closes the first exhaust gas passage 40, and the second valve 50 is rotated clockwise at 90° or at about 90° and opens the bypass passage 14, such that a small amount of exhaust gas flows through the second exhaust gas passage 16, and most of the exhaust gas flows through the bypass passage 14, thereby preventing the vehicle from being overheated.

For convenience in explanation and accurate definition in the appended claims, the terms "upper" or "lower", "front" or "rear", and etc. are used to describe features of the exemplary embodiments with reference to the positions of such features as displayed in the figures.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described in order to explain certain principles of the invention and their practical application, to thereby enable others skilled in the art to make and utilize various exemplary embodiments of the present invention, as well as various alternatives and modifications thereof. It is intended that the scope of the invention be defined by the Claims appended hereto and their equivalents.

What is claimed is:

1. A structure for operating a system for utilizing exhaust heat of a vehicle, comprising:
 - a high-temperature part which includes an exhaust pipe through which high-temperature exhaust gas selectively passes, and a bypass passage which is installed in the exhaust pipe and through which the exhaust gas is selectively bypassed;
 - a thermoelectric element which is attached to an exterior of the exhaust pipe, and generates electricity using a thermoelectric effect;
 - a low-temperature part which is attached to an exterior of the thermoelectric element in a longitudinal direction and in which a coolant flows;
 - a first exhaust gas passage which is installed in the low-temperature part in a longitudinal direction and has both ends connected to the exhaust pipe, and through which the high-temperature exhaust gas selectively passes to heat the coolant;
 - a first valve which is attached to an inner circumferential surface of the exhaust pipe, and formed to selectively open or close one end of the first exhaust gas passage;
 - a second exhaust gas passage which is formed in a space between the inner circumferential surface of the exhaust pipe and an outer circumferential surface of the bypass passage;
 - a second valve which is disposed at a rear end of the bypass passage, coupled to a valve shaft, which is coupled to a side surface of the bypass passage, and installed to be rotatable on the basis of the valve shaft; and
 - an operating unit which has one end connected to the first valve, and the other end connected to a motor and the valve shaft to allow the first valve to be moved in front and rear directions, and to allow the second valve to be rotated on the basis of the valve shaft, by rotation of the motor.

2. The structure of claim 1, wherein the operating unit includes:

an extension portion which is extended rearward from a side surface of the first valve, and has a slit formed in the extension portion in up and down directions;

a first link which has one end, which is accommodated in the slit to be slidable in up and down directions, and is extended rearward;

a second link which has one end that is rotatably connected to the other end of the first link; and a motor drive shaft which is coupled to the other end of the second link, and connects the motor and the second link to allow the second link to be rotated by the rotation of the motor.

3. The structure of claim 2, further comprising:

a valve shaft protruding portion which is formed to protrude at an end of the valve shaft in the longitudinal direction, and has a cross section of a circular sector shape whose central angle is about 90°;

a motor drive shaft depressed portion which is formed to be depressed at an end of the motor drive shaft to accommodate the valve shaft protruding portion; and a motor drive shaft protruding portion which is formed to protrude in the motor drive shaft depressed portion, and has a cross section of a circular sector shape whose central angle is about 90°.

4. The structure of claim 3, wherein when the vehicle runs, the first link is disposed at a lower end of the slit to allow the first valve to close the one end of the first exhaust gas passage, and the valve shaft protruding portion and the motor drive shaft protruding portion are disposed in the motor drive shaft depressed portion at positions where the valve shaft protruding portion and the motor drive shaft protruding portion face each other.

5. The structure of claim 3, wherein when the vehicle initially starts, the motor drive shaft is rotated clockwise at about 90° by the motor on the basis of a position of the motor when the vehicle runs to allow the first link to be disposed substantially at a center portion of the slit, the first valve is moved forward depending on a position of the first link to open the one end of the first exhaust gas passage, and the valve shaft protruding portion and the motor drive shaft protruding portion are disposed at an upper portion of the motor drive shaft depressed portion in a state in which side surfaces of the valve shaft protruding portion and the motor drive shaft protruding portion are in contact with each other.

6. The structure of claim 3, wherein when the vehicle runs in an overloaded state, the motor drive shaft is rotated clockwise at about 180° by the motor on the basis of a position of the motor when the vehicle runs to allow the first link to be disposed at an upper end of the slit, the first valve closes the one end of the first exhaust gas passage depending on a position of the first link, and the valve shaft protruding portion is rotated clockwise at about 90° by rotation of the motor drive shaft protruding portion, in a state in which the valve shaft protruding portion is in contact with the motor drive shaft protruding portion, to rotate the second valve.

7. The structure of claim 1, wherein the low-temperature part includes:

a coolant passage which is coupled to an outer surface of the thermoelectric element, and cools a contact surface with the thermoelectric element using the coolant that flows in the coolant passage;

a coolant distributor which is mounted to one side of the coolant passage to be fluidically communicated with the coolant passage, and has a coolant inlet into which the coolant flows; and a coolant collector which is mounted to the other side of the coolant passage to be fluidically communicated with the coolant passage, and has a coolant outlet from which the coolant is discharged, wherein the coolant passage, the coolant distributor, and the coolant collector are integrally formed to be disposed in the longitudinal direction and to be fluidically communicated with each other.

* * * * *